(12) United States Patent
Jarvelainen

(10) Patent No.: US 9,685,276 B2
(45) Date of Patent: Jun. 20, 2017

(54) CAPACITIVE ENERGY-STORAGE FOR A MOBILE WORKING MACHINE

(71) Applicant: Visedo Oy, Lappeenranta (FI)

(72) Inventor: Tero Jarvelainen, Lappeenranta (FI)

(73) Assignee: Visedo Oy, Lappeenranta (FI)

( * ) Notice: Subject to any disclaimer, the term of this patent is extended or adjusted under 35 U.S.C. 154(b) by 594 days.

(21) Appl. No.: 14/146,967

(22) Filed: Jan. 3, 2014

(65) Prior Publication Data
US 2015/0194273 A1   Jul. 9, 2015

(51) Int. Cl.
| | |
|---|---|
| H05K 7/20 | (2006.01) |
| H01G 11/10 | (2013.01) |
| H01G 11/18 | (2013.01) |
| H01G 11/08 | (2013.01) |
| H01G 11/16 | (2013.01) |
| H02H 7/16 | (2006.01) |
| G01R 31/02 | (2006.01) |
| H01L 23/00 | (2006.01) |

(52) U.S. Cl.
CPC ........... *H01G 11/10* (2013.01); *G01R 31/028* (2013.01); *H01G 11/08* (2013.01); *H01G 11/16* (2013.01); *H01G 11/18* (2013.01); *H01L 24/29* (2013.01); *H02H 7/16* (2013.01); *H05K 7/20409* (2013.01); *Y02E 60/13* (2013.01)

(58) Field of Classification Search
CPC .. F28C 3/08; H01L 24/29; H03K 7/20; H05K 7/20409
USPC ................................. 361/698, 699; 165/80.4
See application file for complete search history.

(56) References Cited

U.S. PATENT DOCUMENTS

| | | | |
|---|---|---|---|
| 6,294,886 B1 | 9/2001 | Gibard | |
| 7,764,498 B2 * | 7/2010 | Conn | ...................... H01L 24/29 165/80.4 |
| 2007/0274045 A1 * | 11/2007 | Campbell | ................. F28C 3/08 361/699 |

(Continued)

FOREIGN PATENT DOCUMENTS

| | | |
|---|---|---|
| CN | 2572660 Y | 9/2003 |
| CN | 1523746 A | 8/2004 |

(Continued)

OTHER PUBLICATIONS

European Search Report, dated Jan. 10, 2013, from corresponding EP application.

*Primary Examiner* — Arnold Kinkead
(74) *Attorney, Agent, or Firm* — Young & Thompson

(57) ABSTRACT

A capacitor module includes a capacitor element, a first voltage terminal connected to a first pole of the capacitor element, and a second voltage terminal connected to a second pole of the capacitor element. The capacitor module further includes a cooling duct system for cooling the capacitor element, and a housing encapsulating the capacitor element and the cooling duct system. The housing comprises wiring lead-throughs for the first and second voltage terminals and piping lead-throughs for the cooling duct system. As the capacitive module is encapsulated and includes the cooling ducts and the wiring and piping lead-throughs, modular capacitive energy-storages of different sizes can be built by interconnecting capacitor modules of the kind described above, and there is no need to build separately an encapsulation provided with cooling ducts.

19 Claims, 3 Drawing Sheets

(56) References Cited

U.S. PATENT DOCUMENTS

2008/0141875 A1   6/2008   Fahrenback

FOREIGN PATENT DOCUMENTS

| CN | 102035357 A | 4/2011 |
| EP | 0 514 840 A2 | 11/1992 |
| GB | 613 627 A | 12/1948 |
| WO | 2006/048431 A1 | 5/2006 |
| WO | 2008/020463 A2 | 2/2008 |

* cited by examiner

CAPACITIVE ENERGY-STORAGE FOR A MOBILE WORKING MACHINE

FIELD OF THE INVENTION

The invention relates generally to capacitive energy-storages. More particularly, the invention relates to a capacitor module suitable for being a basic construction unit of a capacitive energy-storage and to a capacitive energy-storage having a modular structure. Furthermore, the invention relates to a mobile working machine comprising an electromechanical power transmission chain.

BACKGROUND

An electromechanical power transmission chain comprises typically one or more electrical machines and an electronic power converter. The electromechanical power transmission chain can be a series transmission chain where one of the electrical machines operates as generator and the electronic power converter is arranged to convert the electrical voltages produced by the generator into electrical voltages having amplitudes and frequencies suitable for the one or more other electrical machines. The generator can be driven with a combustion engine that can be e.g. a diesel engine, an Otto-cycle engine, or a turbine engine. The other electrical machines can be, for example, electrical motors in wheels of a mobile working machine. The electronic power converter comprises typically an intermediate circuit, a converter stage between the generator and the intermediate circuit and one or more other converter stages between the intermediate circuit and the other electrical machines. Furthermore, there is usually a need for a converter stage between the intermediate circuit and an overvoltage protection resistor and for a converter stage between the intermediate circuit and an energy-storage such as a battery and/or a high capacitance capacitor. It is also possible that the electromechanical power transmission chain is a parallel transmission chain where the generator is occasionally used as a motor that assists the combustion engine, especially when high output power is needed. In this case, the electronic power converter comprises typically an intermediate circuit, a converter stage between the generator and the intermediate circuit, and one or more converter stages between the intermediate circuit and one or more energy-storages. Furthermore, also in conjunction with a parallel transmission chain, there is usually a need for a converter stage for controlling the operation of an overvoltage protection resistor.

As an electromechanical power transmission chain comprises typically many converter stages, energy-storages, and an overvoltage protection resistor, the number of components is high and, consequently, the arrangement of the components and cabling between the components may be complicated and space-consuming. Furthermore, the cooling arrangements related to the converter stages, energy-storages, and the overvoltage protection resistor may also be complicated and space-consuming because of the high number of objects to be cooled.

A typical way to increase the integration level is to use power electronic modules which have an integrated structure and comprise power electronic components so that, for example, a main circuit of the converter stage connected to a generator can be implemented with a single power electronic module. Typically, a power electronic module of the kind mentioned above comprises switching branches each of which comprising a first electrical node, a second electrical node, a third electrical node, and controllable power switches for selecting whether the third electrical node is connected to the first electrical node or to the second electrical node. As the number of phases of an alternating voltage system is typically three, a standard power electronic module contains three switching branches. Each controllable power switch may be, for example but not necessarily, an insulated gate bipolar transistor "IGBT" provided with an anti-parallel diode.

In spite of the power electronic modules of the kind described above, there are still challenges regarding to implementation, cabling, control, and/or cooling of other elements such as a capacitive energy-storage that is typically connected to an intermediate circuit with one or more electronic DC-to-DC power converters. Furthermore, there can be challenges regarding to cabling and/or cooling of one or more inductor coils which are typically parts of the above-mentioned electronic DC-to-DC power converters.

SUMMARY

The following presents a simplified summary in order to provide a basic understanding of some aspects of various invention embodiments. The summary is not an extensive overview of the invention. It is neither intended to identify key or critical elements of the invention nor to delineate the scope of the invention. The following summary merely presents some concepts of the invention in a simplified form as a prelude to a more detailed description of exemplifying embodiments of the invention.

In accordance with the first aspect of the invention, there is provided a new capacitor module that is suitable for storing direct voltage and suitable for being a basic construction unit of a modular capacitive energy-storage. The capacitor module according to the invention comprises:

- a capacitor element,
- a first voltage terminal connected to a first pole of the capacitor element,
- a second voltage terminal connected to a second pole of the capacitor element,
- a cooling duct system for cooling the capacitor element,
- a housing encapsulating the capacitor element and the cooling duct system, the housing comprising wiring lead-throughs for the first and second voltage terminals and piping lead-throughs for the cooling duct system, and
- one or more inductor coils inside the housing and for smoothing current of the capacitor module, each of the inductor coils being connected between a pole of the first voltage terminal and the first pole of the capacitor element so that the first pole of the capacitor element is connected to the pole of the first voltage terminal via the respective inductor coil, wherein walls of the cooling duct system isolate interior space of the cooling duct system from space surrounding the cooling duct system inside the housing.

The housing, the wiring lead-throughs, and the piping lead-throughs are advantageously designed to prevent water and/or external impurities from penetrating into the capacitor module. As the capacitor module is encapsulated and comprises the cooling ducts and the wiring and piping lead-throughs, modular capacitive energy-storages of different sizes can be built by interconnecting capacitor modules of the kind described above, and there is no need to build separately an encapsulation provided with cooling ducts.

The capacitor element of the capacitor module may comprise, for example, an electric double-layer capacitor "EDLC" which is often called a "super capacitor", or many electrically interconnected electric double-layer capacitors.

A capacitor module according an advantageous, exemplifying embodiment of the invention further comprises measuring equipment located inside the housing and configured to measure data related to the capacitor module, and a data interface capable of transmitting the measured data to an external data transfer system. The measured data can indicate, for example, current of the capacitor element, voltage of the capacitor element, currents of parallel connected sub-elements of the capacitor element, voltages of series connected sub-elements of the capacitor element, and/or temperature inside the housing. The external data transfer system can be, for example, a Control Area Network "CAN".

In accordance with the second aspect of the invention, there is provided a new capacitive energy-storage for storing direct voltage. The capacitive energy-storage comprises:
- a capacitor system comprising at least two electrically interconnected capacitor modules, and
- a piping connecting cooling duct systems of the capacitor modules to each other so as to enable the capacitive energy-storage to be connected to an external coolant circulation system.

Each of the capacitor modules comprises:
- a capacitor element arranged to be cooled by the cooling duct system of the capacitor module under consideration,
- a first voltage terminal connected to a first pole of the capacitor element,
- a second voltage terminal connected to a second pole of the capacitor element, and
- a housing encapsulating the capacitor element and the cooling duct system, the housing comprising wiring lead-throughs for the first and second voltage terminals and piping lead-throughs for the cooling duct system, wherein walls of the cooling duct system isolate interior space of the cooling duct system from space surrounding the cooling duct system inside the housing. At least one of the capacitor modules comprises one or more inductor coils inside the housing of this capacitor module. Each of the inductor coils can be used as a part of an electronic power converter connected to the capacitor sys-tem and configured to change voltage of the capacitor system. Thus, there is no need to install inductors coils outside the capacitor modules.

In a capacitive energy-storage according an advantageous, exemplifying embodiment of the invention, one of the capacitor modules comprises a controller located inside the housing of this capacitor module and connected to other capacitors modules via a data transfer system, e.g. a CAN. The controller is configured to generate data related to the capacitive energy-storage on the basis of data measured at the capacitor modules. The generated data can indicate, for example, voltage of the capacitive energy-storage, current of the capacitive energy-storage, power received or given by the capacitive energy storage, voltage distribution between series connected capacitor modules, current distribution between parallel connected capacitor modules, and/or maximum temperature of the capacitive energy-storage. Furthermore, the controller can be configured to control, on the basis of the generated data, an over-voltage protection resistor and/or an electronic power converter connected to the capacitor system and configured to change voltage of the capacitor system.

In accordance with the third aspect of the invention, there is provided a new mobile working machine. The mobile working machine comprises:
- a combustion engine, and
- an electromechanical power transmission chain between the combustion engine and one or more wheels, chain tracks, or other actuators of the mobile working machine, wherein the electromechanical transmission chain comprises at least one capacitive energy-storage according to the present invention.

The mobile working machine comprises preferably a liquid cooling system connected to the piping of the capacitive energy-storage and configured to cool both a hydraulic system of the mobile working machine and the electromechanical power transmission chain. The mobile working machine can be, for example, a tractor, a bucket charger, a road drag, a bulldozer, or any other working machine having wheels and/or chain tracks.

A number of non-limiting exemplifying embodiments of the invention are described in accompanied dependent claims.

Various exemplifying embodiments of the invention both as to constructions and to methods of operation, together with additional objects and advantages thereof, will be best understood from the following description of specific exemplifying embodiments when read in connection with the accompanying drawings.

The verbs "to comprise" and "to include" are used in this document as an open limitation that neither exclude nor require the existence of unrecited features. The features recited in dependent claims are mutually freely combinable unless otherwise explicitly stated.

BRIEF DESCRIPTION OF THE FIGURES

The exemplifying embodiments of the invention and their advantages are explained in greater detail below in the sense of examples and with reference to the accompanying drawings, in which.

DESCRIPTION OF THE EXEMPLIFYING EMBODIMENTS

Figure 1:
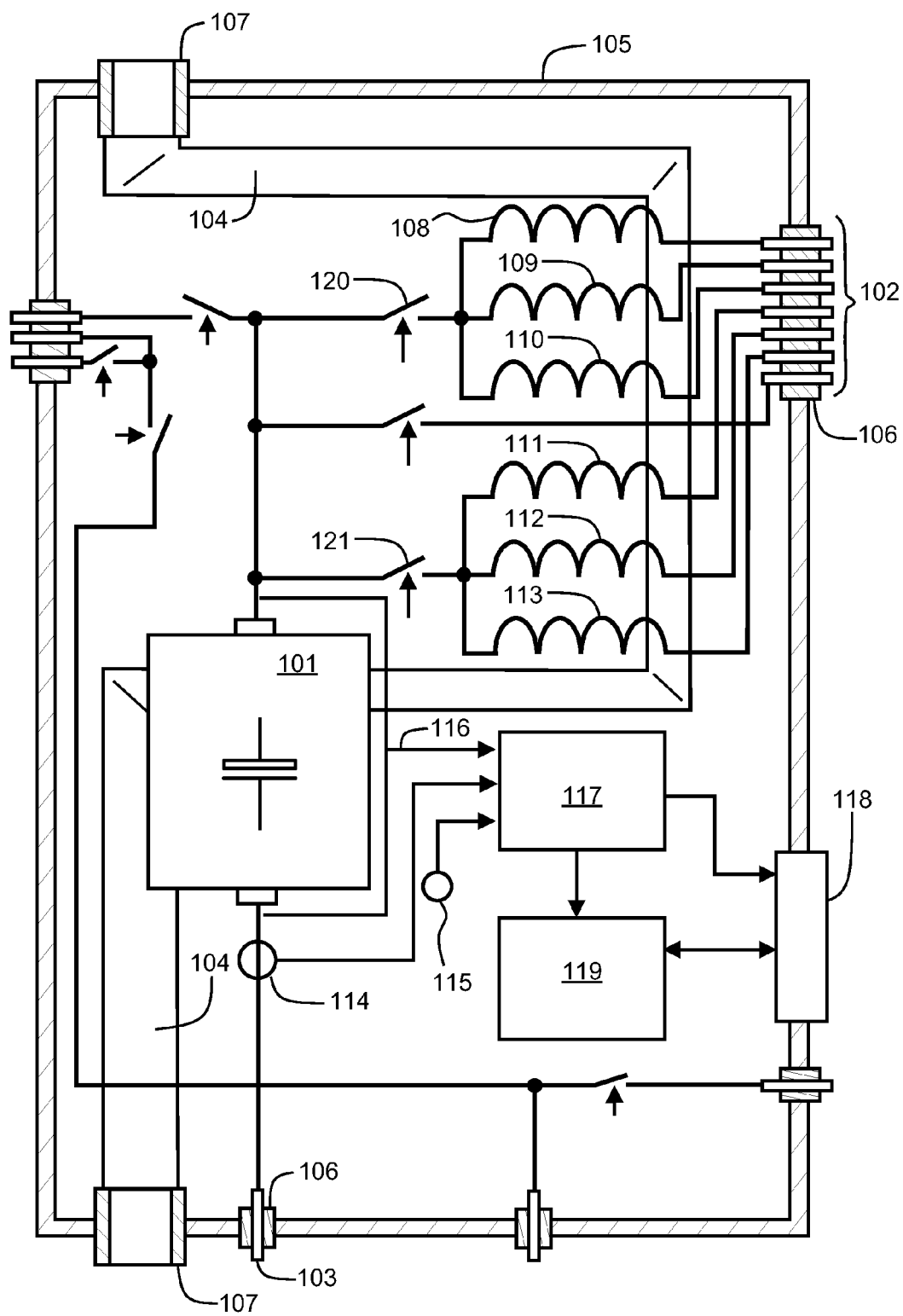
FIG. 1 shows a schematic illustration of a capacitor module according to an exemplifying embodiment of the invention.

FIG. 1 shows a schematic section-view of a capacitor module according to an exemplifying embodiment of the invention. The capacitor module comprises a capacitor element 101 that may comprise, for example, an electric double-layer capacitor "EDLC" which is often called a "super capacitor", or many electrically interconnected electric double-layer capacitors; e.g. many series connected capacitors, many parallel connected capacitors, or series connected sets of parallel connected capacitors. The capacitor module comprises a first voltage terminal 102 connected to a first pole of the capacitor element 101, and a second voltage terminal 103 connected to a second pole of the capacitor element. The capacitor module comprises a cooling duct system 104 for conducting coolant so as to cool the capacitor element. The capacitor module comprises a housing 105 that encapsulates the capacitor element 101 and the cooling duct system 104. The housing comprises wiring lead-throughs 106 for the first and second voltage terminals 102 and 103, and piping lead-throughs 107 for the cooling duct system 104. In the exemplifying case illustrated in FIG. 1, the cooling duct system 104 is a tube between the piping lead-throughs 107. The walls of the tube isolate the interior space of the cooling duct system from the space surrounding the cooling duct system inside the housing 105. Therefore, the cooling duct system 104 is suitable for liquid cooling.

The housing 105, the wiring lead-throughs 106, and the piping lead-throughs 107 are advantageously designed to prevent water and/or external impurities from penetrating into the capacitor module. For example, the housing, the wiring lead-throughs, and the piping lead-throughs can be designed to prevent at least ingress of solid particles greater than 1 mm. It is also possible that the housing, the wiring lead-throughs, and the piping lead-throughs constitute a dust protected or dust-tight structure. Furthermore, the structure can be jet water protected or water-tight. The Ingress Protection rating "IP" classification of the structure is advantageously at least IP55, more advantageously IP65-IP68. More information about the IP classification can be found from the international standard IEC 60529. As the capacitor module is encapsulated and comprises the cooling ducts and the wiring and piping lead-throughs, modular capacitive energy-storages of different sizes can be built by interconnecting capacitor modules of the kind described above, and there is no need to build separately an encapsulation provided with cooling ducts.

A capacitor module according to an exemplifying embodiment of the invention comprises one or more inductor coils inside the housing so that each of the inductor coils is connected between a pole of the first voltage terminal 102 and the first pole of the capacitor element. In the exemplifying case illustrated in FIG. 1, the capacitor module comprises inductor coils 108, 109, 110, 111, 112, and 113. Each of these inductor coils is suitable for being an inductor coil of an electronic DC-to-DC power converter that is, in some cases, needed for changing voltage. The cooling duct system 104 is preferably configured to cool also the inductor coils 108-113 as illustrated in FIG. 1. As the inductor coils are inside the capacitor module, the implementation of the above-mentioned electronic DC-to-DC power converter is easier and simpler.

A capacitor module according to an exemplifying embodiment of the invention comprises measuring equipment located inside the housing and configured to measure data related to the capacitor module. The measured data can indicate, for example, current of the capacitor element 101, voltage of the capacitor element, currents of parallel connected sub-elements of the capacitor element, voltages of series connected sub-elements of the capacitor element, and/or temperature inside the housing. The measuring equipment may comprise, for example, a current sensor 114, a temperature sensor 115, a voltage sensor 116, and a signal converter 117 for converting the output signals of these sensors to a desired digital form. The capacitor module comprises a data interface 118 capable of transmitting the measured data to an external data transfer system that can be, for example, a Control Area network "CAN".

A capacitor module according to an exemplifying embodiment of the invention comprises a controller 119 connected to the data interface 118 and to the signal converter 117 of the measuring equipment. In this case, the data interface 118 is preferably capable of both transmitting and receiving data to and from an external data transfer system, e.g. a CAN. The controller 119 can be configured to generate control data, monitoring data, and/or alarm data on the basis of data measured in the capacitor module and/or on the basis of data received at the data interface 118. Monitoring data may indicate, for example, voltage, current and/or maximum temperature of a capacitive energy-storage comprising the capacitor module and one or more other capacitor modules. Alarm data may indicate, for example, that a measured value, e.g. measured temperature, has exceeded its highest allowable value. Control data may contain, for example, signals for operating controllable elements of the capacitor module and/or controllable elements connected to the capacitor module.

A capacitor module according to an exemplifying embodiment of the invention comprises switches 120 and 121 on a current path between the first and second direct voltage terminals 102 and 103, and the controller 119 is configured to operate the switches on the basis of measured data and/or data received at the data interface 118. As illustrated by FIG. 1, the capacitor module may comprise also other switches which may be controllable with the controller 119. The switches can be, for example, current-operated relays or semiconductor switches. The switches can be used, for example, for controlling operation of a pre-charge/discharge resistor that is not shown in FIG. 1.

Figure 2:
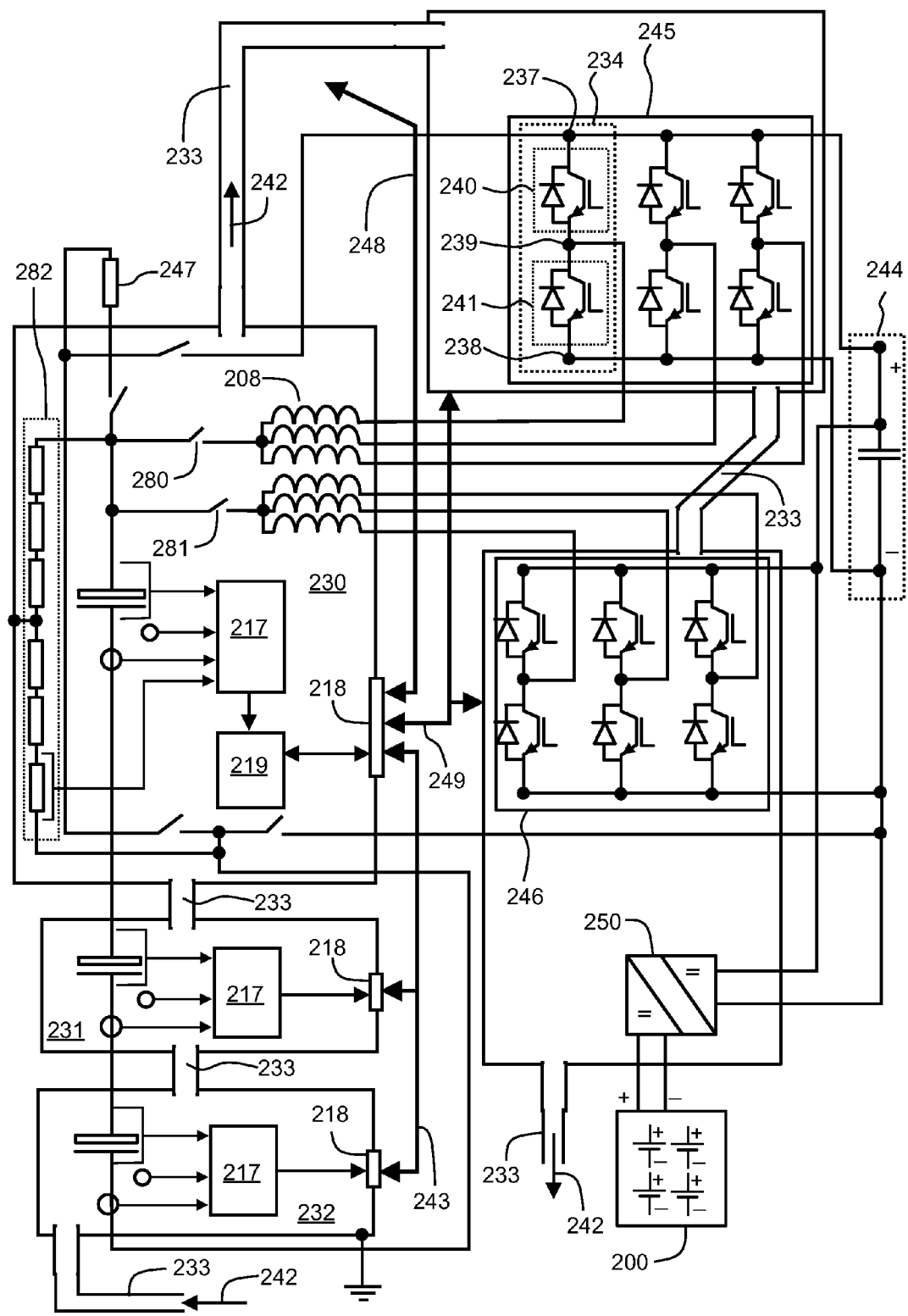
FIG. 2 shows a schematic illustration of a capacitive energy-storage according to an exemplifying embodiment of the invention.

FIG. 2 shows a schematic illustration of a capacitive energy-storage according to an exemplifying embodiment of the invention. The capacitive energy-storage comprises a capacitor system comprising series connected capacitor modules 230, 231, and 232. Each of the capacitor modules 230-232 comprises a capacitor element, voltage terminals connected to poles of the capacitor element, a cooling duct system, and a housing encapsulating the capacitor element and the cooling duct system. The capacitive energy-storage comprises a piping 233 connecting the cooling duct systems of the capacitor modules to each other so as to enable the capacitive energy-storage to be connected to an external coolant circulation system. The arrows 242 shown in FIG. 2 illustrate a flow of coolant arranged to cool the capacitive energy-storage. The coolant is preferably liquid but it is also possible that the coolant is gaseous.

In a capacitive energy-storage according to an exemplifying embodiment of the invention, each of the capacitor modules 230-232 comprises measuring equipment located inside the housing of the capacitor module and configured to measure data related to the capacitor module under consideration. The measuring equipment may comprise, for example, voltage, current, and temperature sensors and a signal converter 217 for converting the output signals of the sensors to a desired digital form. Each of the capacitor modules 230-232 comprises a data interface 218 capable of transmitting the measured data to an external data transfer system 243 that can be, for example, a CAN-bus between the capacitor modules.

A capacitive energy-storage according to an exemplifying embodiment of the invention comprises electronic DC-to-DC power converters configured to change voltage of the capacitor system comprising the series connected capacitor modules 230-232. Each of the electronic DC-to-DC power converters comprises an inductor coil that is located inside the housing of the first capacitor module 230 and a power electronic circuit located outside the housings of the capacitor modules. For example, the main circuit of one of the DC-to-DC power converters comprises the inductor coil 208 and the power electronic circuit 234. The power electronic circuit 234 comprises a first electrical node 237 connected to a positive pole of a direct polarity link 244, a second electrical node 238 connected to a negative pole of the direct polarity link 244, a third electrical node 239 connected to the inductor coil 208 related to this DC-to-DC power converter, and controllable power switches 240 and 241 for selecting whether the third electrical node 239 is connected to the first electrical node 237 or to the second electrical node 238. In the exemplifying case shown in FIG. 2, the direct polarity link 244 is a direct voltage link comprising a capacitor. Each controllable power switch may be, for example, an insulated gate bipolar transistor "IGBT" provided with an anti-parallel diode as illustrated in FIG. 1, or a gate-turn-off "GTO" thyristor provided with an anti-parallel diode, or some other suitable power electronic component.

The above-described electronic DC-to-DC power converter can be operated as a step-down DC-to-DC converter when transferring energy from the direct polarity link 244 to the capacitor modules 230-232, and as a step-up DC-to-DC converter when transferring energy from the capacitor modules 230-232 to the direct polarity link 224. The step-down operation can be achieved by switching the controllable power switch 240 on and off when the diode of the controllable power switch 241 operates as a free-wheeling diode. The step-up operation can be achieved by switching the controllable power switch 241 on and off when the diode of the controllable power switch 240 operates as a charging diode. In the exemplifying case illustrated in FIG. 2, there are, in total, six parallel connected electronic DC-to-DC power converters of the kind described above. Two or more of these electronic DC-to-DC power converters are preferably operated with interleaved duty-cycles in order to reduce the voltage ripple at the direct polarity link 244 and/or to reduce the switching losses. The six electronic DC-to-DC power converters can be implemented with two six pack modules 245 and 246 as illustrated in FIG. 2. The six pack modules can be, for example, SEMIKRON SKiM459GD12E4 modules.

In a capacitive energy-storage according to an exemplifying embodiment of the invention, the power electronic circuits of the electronic DC-to-DC power converters are provided with cooling ducts connected to the piping 233. In this case, the same flow of coolant 242 which cools the capacitor modules 230-232 cools also the power electronic circuits of the electronic DC-to-DC power converters.

In a capacitive energy-storage according to an exemplifying embodiment of the invention, the first capacitor module 230 comprises a controller 219 located inside the housing of the first capacitor module and connected to the data interface 218 of the first capacitor module and to the signal converter 217 of the measuring equipment of the first capacitor module. The controller 219 can be configured to generate control data, monitoring data, and/or alarm data related to the capacitive energy-storage on the basis of data measured in the capacitor modules 230-232 and/or data received from a data transfer system 248. The data transfer system 248 can be, for example, a CAN-bus between the capacitive energy-storage and other parts of a device, e.g. a mobile working machine, comprising the capacitive energy-storage. In this exemplifying embodiment of the invention, the first capacitor module 230 is a controlling capacitor module, i.e. a master capacitor module, and the capacitor modules 231 and 232 are slave capacitor modules. Monitoring data may indicate, for example, voltage of the capacitive energy-storage, current of the capacitive energy-storage, power received or delivered by the capacitive energy storage, voltage distribution between the series connected capacitor modules 230-232, and/or maximum temperature occurring in the capacitive energy-storage. Alarm data may indicate, for example, that one or more measured quantities deviate too much from their allowed areas.

In a capacitive energy-storage according to an exemplifying embodiment of the invention, the controller 219 is configured to control the electronic DC-to-DC power converters shown in FIG. 2 the basis of control data based on data measured in the capacitor modules 230-232 and/or data received from the data transfer system 248. Communication between the controller 219 and the electronic DC-to-DC power converters can be implemented with, for example, a CAN-bus 249. Furthermore, the controller 219 can be configured to control switches of the capacitor module 230 so that a resistor 247 operates, when needed, as a pre-charge resistor or as a discharge resistor of the series connected capacitor modules 230-232.

In a capacitive energy-storage according to an exemplifying embodiment of the invention, the first capacitor module 230 comprises one or more protection relays 280, 281 located inside the housing of the first capacitor module and the controller 219 is configured to control the protection relays to break-off the current of the capacitive energy-storage in response to at least one of the following situations: the current of the capacitive energy-storage exceeds a pre-determined limit current, voltage of the capacitive energy-storage exceeds a pre-determined limit voltage, temperature of the capacitive energy-storage exceeds a pre-determined limit temperature.

In a capacitive energy-storage according to an exemplifying embodiment of the invention, the first capacitor module 230 comprises a fault-current detector 282 located inside the housing of the first capacitor module and configured to detect leakage current between a high voltage terminal of the capacitor system and the housings of the capacitor modules and leakage current between a low voltage terminal of the capacitor system and the housings of the capacitor modules. The fault-current detector 282 can be, for example but not necessarily, a resistor chain as illustrated in FIG. 2. The resistor chain provides voltage division between the high and low voltage terminals of the capacitor system. One point of the resistor chain is connected to the housing of the first capacitor module 230 as illustrated in FIG. 2. If there is any leakage current between the high voltage terminal and the housings of the capacitor modules or between the low voltage terminal and the housings of the capacitor modules, the voltage division is changed, and this can be detected by measuring voltage of one of the resistors.

A capacitive energy-storage according to an exemplifying embodiment of the invention comprises an electronic DC-to-DC power converter 250 suitable for operating between the direct polarity link 244 and a battery 251. The battery can be, for example, a 12 V/24 V battery. It is also possible that the battery 251 has a significantly higher voltage than 12 V or 24 V, i.e. the battery 251 can be a high-voltage "HV" battery.

Figure 3:
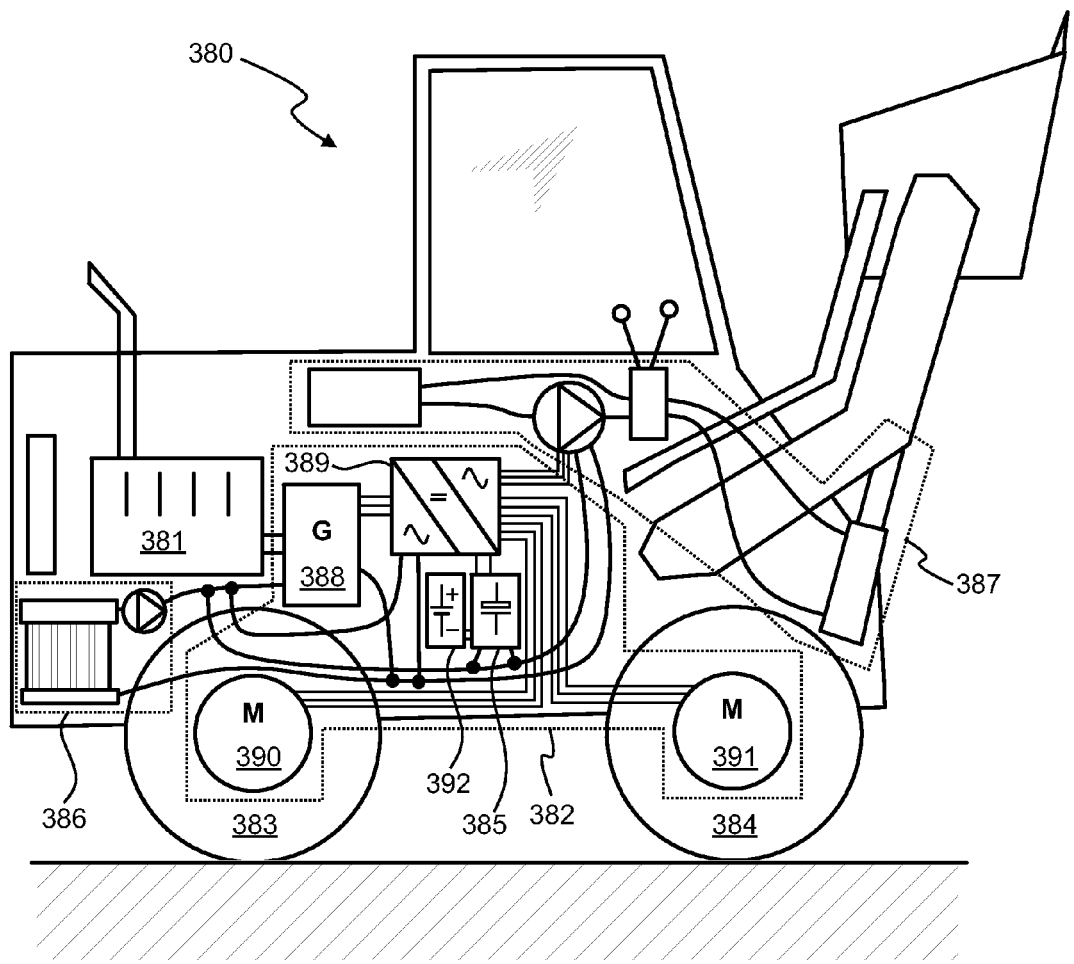
FIG. 3 shows a schematic illustration of a mobile working machine according to an exemplifying embodiment of the invention.

FIG. 3 shows an illustration of a mobile working machine 380 according to an exemplifying embodiment of the invention. In this exemplifying case, the mobile working machine is a bucket charger but the mobile working machine could as well be a tractor, a road drag, a bulldozer, or any other working machine having wheels and/or chain tracks. The mobile working machine comprises a combustion engine 381 that can be e.g. a diesel engine, an Otto-cycle engine, or a turbine engine. The mobile working machine comprises an electromechanical power transmission chain 382 between the combustion engine 381 and wheels 383, 384 of the mobile working machine. The electromechanical transmission chain comprises a generator 388 the rotor of which is connected to the shaft of the combustion engine. The electromechanical transmission chain comprises an electronic power converter 389 and electrical motors 390, 391 at the hubs of the wheels of the mobile working machine. The electronic power converter 389 is arranged to convert the electrical voltage produced by the generator 388 into electrical voltages having amplitudes and frequencies suitable for the electrical motors 390, 391. The electromechanical transmission chain further comprises a capacitive energy-storage 385 comprising at least two electrically interconnected capacitor modules. Each of the capacitor modules comprises a capacitor element, voltage terminals connected to poles of the capacitor element, a cooling duct system, and a housing encapsulating the capacitor element and the cooling duct system. One of the capacitor modules comprises preferably a controller that controls all the capacitor modules as illustrated earlier with the aid of FIG. 2. The capacitive energy-storage 385 comprises a piping that connects the cooling duct systems of the capacitor modules to each other.

A mobile working machine according to an exemplifying embodiment of the invention comprises a liquid cooling system 386 connected to the piping of the capacitive energy-storage 385 and configured to cool the electromechanical power transmission chain 382 and a hydraulic system 387 of the mobile working machine.

A mobile working machine according to an exemplifying embodiment of the invention comprises a liquid cooling system 386 connected to the piping of the capacitive energy-storage and configured to cool the electromechanical power transmission chain 382 and the combustion engine 381.

A mobile working machine according to an exemplifying embodiment of the invention comprises a battery 392 which, together with the capacitive energy-storage 385, can be used for responding to peak power needs exceeding the maximum power of the combustion engine 381.

The specific examples provided in the description given above should not be construed as limiting the applicability and/or interpretation of the appended claims.

What is claimed is:

1. A capacitor module for storing direct voltage, the capacitor module comprising:
    a capacitor element;
    a first voltage terminal connected to a first pole of the capacitor element;
    a second voltage terminal connected to a second pole of the capacitor element;
    a cooling duct system configured to cool the capacitor element;
    a housing encapsulating the capacitor element and the cooling duct system, the housing comprising
       wiring lead-throughs for the first and second voltage terminals, and
       piping lead-throughs for the cooling duct system; and
    one or more inductor coils inside the housing and configured to smooth current of the capacitor module, each of the inductor coils being connected between a pole of the first voltage terminal and the first pole of the capacitor element so that the first pole of the capacitor element is connected to the pole of the first voltage terminal via the respective inductor coil,
    wherein walls of the cooling duct system isolate an interior space of the cooling duct system from space surrounding the cooling duct system inside the housing.

2. The capacitor module according to claim 1, wherein the housing, the wiring lead-throughs, and the piping lead-throughs are configured to prevent solid particles greater than 1 mm from penetrating into the space surrounding the cooling duct system inside the housing.

3. The capacitor module according to claim 2, wherein the housing, the wiring lead-throughs, and the piping lead-throughs are configured to seal the space surrounding the cooling duct system inside the housing to be at least one of the following: dust-tight and water-tight.

4. The capacitor module according to claim 1, further comprising:
    measuring equipment located inside the housing and configured to measure data related to the capacitor module; and
    a data interface configured to transmit the measured data to an external data transfer system.

5. The capacitor module according to claim 4, wherein the measuring equipment is configured to measure data indicative of at least one of the following: current of the capacitor element, voltage of the capacitor element, currents of parallel connected sub-elements of the capacitor element, voltages of series connected sub-elements of the capacitor element, and the temperature inside the housing.

6. The capacitor module according to claim 4, wherein the data interface is configured to receive data from the external data transfer system, and
    the capacitor module further comprises a controller connected to the data interface and to the measuring equipment, the controller being configured to generate data related to a capacitive energy-storage comprising the capacitor module and one or more other capacitor modules on the basis of the measured data and the data received from the external data transfer system.

7. The capacitor module according to claim 6, wherein the controller is configured to generate data indicating at least one of the following: voltage of the capacitive energy-storage on the basis of data indicative of voltages of the capacitor module and the one or more other capacitor modules, current of the capacitive energy-storage on the basis of data indicative of currents of the capacitor module and the one or more other capacitor modules, and maximum temperature of the capacitive energy-storage on the basis of data indicative of temperatures of the capacitor module and the one or more other capacitor modules.

8. The capacitor module according to claim 1, wherein the capacitor element comprises one or more electric double-layer capacitors.

9. A capacitive energy-storage for storing direct voltage, the capacitive energy-storage comprising:
    a capacitor system comprising at least two electrically interconnected capacitor modules each comprising a cooling duct system, one of the capacitor modules being a first capacitor module, and
    a piping connecting the cooling duct systems of the capacitor modules to each other to enable the capacitive energy-storage to be connected to an external coolant circulation system,
    wherein each of the at least two electrically interconnected capacitor modules comprises:
       a capacitor element configured to be cooled by the cooling duct system of the capacitor module,
       a first voltage terminal connected to a first pole of the capacitor element,
       a second voltage terminal connected to a second pole of the capacitor element, and
       a housing encapsulating the capacitor element and the cooling duct system, the housing comprising
          wiring lead-throughs for the first and second voltage terminals, and
          piping lead-throughs for the cooling duct system, wherein at least one of the capacitor modules comprises one or more inductor coils inside the housing of the at least one capacitor module and configured to smooth current of the at least one capacitor module, each of the inductor coils being connected between a pole of the first voltage terminal of the at least one capacitor module and the first pole of the capacitor element of the at least one capacitor module so that the first pole of the capacitor element of the at least one capacitor module is connected to the pole of the first voltage terminal of the at least one capacitor module via the respective inductor coil, and wherein walls of the cooling duct system isolate an interior space of the cooling duct system from space surrounding the cooling duct system inside the housing.

10. The capacitive energy-storage according to claim 9, wherein each of the capacitor modules comprises measuring equipment located inside the housing of the capacitor module and configured to measure data related to this capacitor module, and each of the capacitor modules comprises a data interface configured to transmit the measured data to an external data transfer system.

11. The capacitive energy-storage according to claim 9, further comprising at least one electronic power converter connected to the capacitor system and configured to change voltage of the capacitor system, the electronic power converter comprising one of the inductor coils located inside the housing of the first capacitor module and a power electronic circuit located outside the housings of the capacitor modules.

12. The capacitive energy-storage according to claim 11, further comprising a cooling duct connected to the piping and configured to cool the power electronic circuit of the electronic power converter.

13. The capacitive energy-storage according to claim 11, wherein the power electronic circuit of the electronic power converter comprises
a first electrical node,
a second electrical node connected to the capacitor system,
a third electrical node connected to the inductor coil, and
controllable power switches configured to select whether the third electrical node is connected to the first electrical node or to the second electrical node.

14. The capacitive energy-storage according to claim 10, wherein the first capacitor module comprises a controller located inside the housing of the first capacitor module and connected to the data interface of the first capacitor module and to the measuring equipment of the first capacitor module, the controller being configured to generate data related to the capacitive energy-storage at least partly on the basis of data measured in the capacitor modules.

15. The capacitive energy-storage according to claim 14, wherein the first capacitor module comprises one or more protection relays located inside the housing of the first capacitor module, and
the controller is configured to control the protection relays to break-off current of the capacitive energy-storage in response to at least one of the following situations: the current of the capacitive energy-storage exceeds a pre-determined limit current, voltage of the capacitive energy-storage exceeds a pre-determined limit voltage, and the temperature of the capacitive energy-storage exceeds a pre-determined limit temperature.

16. The capacitive energy-storage according to claim 9, wherein the first capacitor module comprises a fault-current detector located inside the housing of the first capacitor module and configured to detect leakage current between a high voltage terminal of the capacitor system and the housings of the capacitor modules and leakage current between a low voltage terminal of the capacitor system and the housings of the capacitor modules.

17. A mobile working machine comprising:
a combustion engine; and
an electromechanical power transmission chain between the combustion engine and one or more actuators of the mobile working machine,
wherein the electromechanical power transmission chain comprises a capacitive energy-storage that comprises:
a capacitor system comprising at least two electrically interconnected capacitor modules each comprising a cooling duct system, one of the capacitor modules being a first capacitor module, and
a piping connecting the cooling duct systems of the capacitor modules to each other so as to enable the capacitive energy-storage to be connected to an external coolant circulation system,
wherein each of the at least two electrically interconnected capacitor modules comprises:
a capacitor element configured to be cooled by the cooling duct system of the capacitor module under consideration,
a first voltage terminal connected to a first pole of the capacitor element,
a second voltage terminal connected to a second pole of the capacitor element, and
a housing encapsulating the capacitor element and the cooling duct system, the housing comprising
wiring lead-throughs for the first and second voltage terminals, and
piping lead-throughs for the cooling duct system,
wherein at least one of the capacitor modules comprises one or more inductor coils inside the housing of the at least one capacitor module and configured to smooth current of the at least one capacitor module, each of the inductor coils being connected between a pole of the first voltage terminal of the at least one capacitor module and the first pole of the capacitor element of the at least one capacitor module so that the first pole of the capacitor element of the at least one capacitor module is connected to the pole of the first voltage terminal of the at least one capacitor module via the respective inductor coil, and
wherein walls of the cooling duct system isolate interior space of the cooling duct system from space surrounding the cooling duct system inside the housing.

18. The mobile working machine according to claim 17, wherein the mobile working machine comprises a liquid cooling system connected to the piping of the capacitive energy-storage and configured to cool the electromechanical power transmission chain and a hydraulic system of the mobile working machine.

19. The mobile working machine according to claim 17, wherein the mobile working machine comprises a liquid cooling system connected to the piping of the capacitive energy-storage and configured to cool the electromechanical power transmission chain and the combustion engine.

* * * * *